United States Patent
Zhong et al.

(10) Patent No.: US 11,817,849 B2
(45) Date of Patent: Nov. 14, 2023

(54) METHOD AND DEVICE FOR ADJUSTING THE SWITCHING SPEED OF A MOSFET

(71) Applicant: SOOCHOW UNIVERSITY, Suzhou (CN)

(72) Inventors: Bowen Zhong, Suzhou (CN); Daqian Zhang, Suzhou (CN); Lining Sun, Suzhou (CN)

(73) Assignee: SOOCHOW UNIVERSITY, Suzhou (CN)

(*) Notice: Subject to any disclaimer, the term of this patent is extended or adjusted under 35 U.S.C. 154(b) by 15 days.

(21) Appl. No.: 17/441,002

(22) PCT Filed: Aug. 11, 2020

(86) PCT No.: PCT/CN2020/108355
§ 371 (c)(1),
(2) Date: Sep. 20, 2021

(87) PCT Pub. No.: WO2021/139152
PCT Pub. Date: Jul. 15, 2021

(65) Prior Publication Data
US 2022/0166420 A1   May 26, 2022

(30) Foreign Application Priority Data

Jan. 8, 2020 (CN) .................. 202010017783.X

(51) Int. Cl.
*H03K 17/041* (2006.01)
(52) U.S. Cl.
CPC ............... *H03K 17/04106* (2013.01)

(58) Field of Classification Search
CPC ................................................ H03K 17/04106
See application file for complete search history.

(56) References Cited

U.S. PATENT DOCUMENTS

2021/0320649 A1* 10/2021 Wang ................. H03K 17/6871

FOREIGN PATENT DOCUMENTS

| CN | 101895281 A | 11/2010 | |
|----|-------------|---------|---|
| CN | 103944549 A | 7/2014 | |
| CN | 109981088 A | 7/2019 | |
| CN | 111162763 A | 5/2020 | |
| JP | 2006222593 A | 8/2006 | |
| JP | 4967568 B2 | 7/2012 | |
| WO | WO-2019021159 A1 * | 1/2019 | .............. H02M 1/08 |

* cited by examiner

*Primary Examiner* — Daniel C Puentes
(74) *Attorney, Agent, or Firm* — SZDC LAW P.C.

(57) ABSTRACT

A method and device for adjusting the switching speed of a MOSFET are disclosed. The MOSFET is connected to drive switch, the collector of the drive switch is connected to the grid of the MOSFET through the grid resistor, the emitter of the drive switch is grounded through the emitter resistor, and the collector of the drive switch is also connected to the source resistor through the collector resistor, the other end of the source resistor is connected to the source of the MOSFET; the drain of the MOSFET is connected to the current source. The method comprises: obtaining the adjustment target of the switching speed for the MOSFET, determining the first resistance value of the emitter resistor and/or the second resistance value of the collector resistor based on said adjustment target, controlling the operation of the MOSFET according to the adjusted resistance value.

8 Claims, 6 Drawing Sheets

```
┌─────────────────────────────────────────────────┐
│ Emitter resistor and collector resistor can be  │
│ adjustable resistors                            │
└─────────────────────────────────────────────────┘
```

*FIG. 7*

```
┌─────────────────────────────────────────────────┐
│              Adjustment Target                  │
└─────────────────────────────────────────────────┘
                        │
                        ▼
┌─────────────────────────────────────────────────┐
│ A first adjustment target for adjusting the turn-│
│ on speed to determine the first resistance      │
│ value of said emitter resistor, and/or          │
│                                                 │
│ A second adjustment target for adjusting the    │
│ turn-off speed to determine the second          │
│ resistance value of said collector resistor     │
└─────────────────────────────────────────────────┘
```

*FIG. 8*

METHOD AND DEVICE FOR ADJUSTING THE SWITCHING SPEED OF A MOSFET

This invention is the National Stage Application of PCT/CN2020/108355, filed on Aug. 11, 2020, which claims the priority of the Chinese invention No. 202010017783.X, filed on Jan. 8, 2020, the content of which is incorporated into this invention by reference.

TECHNICAL FIELD

This invention relates to a method and device for adjusting the switching speed of a MOSFET, which belongs to the field of electronic technology.

BACKGROUND OF THE INVENTION

Metal-Oxide-Semiconductor Field-Effect Transistor (MOSFET), has the same amplifying effect as the other transistors.

When the MOSFET is used in the amplifier, it is usually connected to the drive switch. The drive switch is used to drive the on and off of the MOSFET, and the drive switch is usually implemented as a triode. Specifically, the collector of the drive switch is connected to the grid of the MOSFET through the grid resistor, the emitter of the drive switch is grounded through the emitter resistor, and the collector of the drive switch is also connected to the source resistor through the collector resistor. The other end of the source resistor is connected to the source of the MOSFET; the drain of the MOSFET is connected to the current source.

In the above connection relationship, the voltage $V_{DS}$ of the inter-electrode capacitor (i.e. $C_{ds}$) between the drain and the source increases or decrease during the plateau period of the voltage $V_{GS}$ for the inter-electrode capacitor (i.e. $C_{gs}$) between the grid and the source, the grid current $i_g$ is almost entirely used for the inter-electrode capacitor to charge and discharge, which causes the voltage of the $C_{ds}$ to rise or fall, whereas the $C_{gs}$ voltage remains constant at the plateau voltage $V_{p.}$. This phenomenon is known as the Miller effect of a MOSFET.

The Miller effect will slow down the turn-on and turn-off speed of the MOSFET, Therefore, how to adjust the switching speed of the MOSFET has become an urgent problem to be solved.

SUMMARY OF THE INVENTION

It is therefore an object of this invention to provide a method and device for adjusting the switching speed of the MOSFET, which can solve the problem that the turn-on and turn-off process for the existing MOSFET would delay due to the influence of the Miller effect. This invention provides the following technical solutions:

Firstly, a switching speed adjustment method for MOSFET has been provided, wherein said MOSFET is connected to drive switch, the collector of said drive switch is connected to the grid of said MOSFET through the grid resistor, the emitter of said drive switch is grounded through the emitter resistor, and the collector of said drive switch is also connected to the source resistor through the collector resistor, the other end of said source resistor is connected to the source of said MOSFET; the drain of said MOSFET is connected to the current source, said method comprises:
  obtaining the adjustment target of the switching speed for said MOSFET,
  determining the first resistance value of said emitter resistor and/or the second resistance value of said collector resistor based on said adjustment target,
  controlling the operation of said MOSFET according to the adjusted resistance value.

Optionally, said adjustment target comprises:
  a first adjustment target for adjusting the turn-on speed and determining the first resistance value of said emitter resistor, and/or
  a second adjustment target for adjusting the turn-off speed and determining the second resistance value of said collector resistor.

Optionally, the turn-on speed indicated by said first adjustment target is negatively correlated with said first resistance value, the turn-off speed indicated by said second adjustment target is negatively correlated with said second resistance value.

Optionally, the step of determining the first resistance value of said emitter resistor based on said first adjustment target, comprises:
  obtaining the first corresponding relationship between the turn-on speed and the resistance value of said emitter resistor,
  determining the first resistance value corresponding to the turn-on speed that is indicated by said first adjustment target according to said first corresponding relationship.

Optionally, the step of determining the second resistance value of said collector resistor based on said second adjustment target, comprises:
  obtaining the second corresponding relationship between the turn-off speed and the resistance value of said collector resistor,
  determining the second resistance value corresponding to the turn-off speed that is indicated by said second adjustment target according to said second corresponding relationship.

Optionally, said drive switch can be made of PNP-type triode.

Optionally, said emitter resistor and said collector resistor can be adjustable resistors.

Secondly, a switching speed adjustment device for MOSFET has been provided, wherein said MOSFET is connected to drive switch, the collector of said drive switch is connected to the grid of said MOSFET through the grid resistor, the emitter of said drive switch is grounded through the emitter resistor, and the collector of said drive switch is also connected to the source resistor through the collector resistor, the other end of said source resistor is connected to the source of said MOSFET, the drain of said MOSFET is connected to the current source, said device comprises:
  a target acquisition module for obtaining the adjustment target of the switching speed for said MOSFET
  a resistance determination module for determining the first resistance value of said emitter resistor and/or the second resistance value of said collector resistor based on said adjustment target,
  an operation control module for controlling the operation of said MOSFET according to the adjusted resistance value.

Optionally, said resistance determination module is used for the adjustment target, said adjustment target comprises:
  a first adjustment target for adjusting the turn-on speed to determine the first resistance value of said emitter resistor, and/or, a second adjustment target for adjusting t the turn-off speed to determine the second resistance value of said collector resistor.

Optionally, the turn-on speed indicated by said first adjustment target is negatively correlated with said first resistance value, the turn-off speed indicated by said second adjustment target is negatively correlated with said second resistance value.

The beneficial effects of this invention are: By taking the following measures of acquiring the adjustment target of the switching speed for the MOSFET, determining the first resistance value of the emitter resistor and/or the second resistance value of the collector resistor based on the adjustment target, controlling the operation of the MOSFET according to the adjusted resistance value, it can solve the problem of the delayed turn-on and turn-off process for the existing MOSFET due to the influence of the Miller effect. Since the turn-off speed of the MOSFET can be adjusted by the resistance value of the collector resistor, and/or the turn-on speed of the MOSFET can be adjusted by the resistance value of the emitter resistor, the switching speed of the MOSFET can be adjusted as required.

The foregoing explanation is only an overview of the technical scheme of this invention. In order to better understand the technical means of this invention and implement it in accordance with the content of the specification, the following is a better implementation example of this invention together with the attached drawings for detailed explanation.

BRIEF DESCRIPTION OF THE DRAWINGS

FIG. 7 is a block diagram of an emitter resistor and collector resistor can be adjustable resistors by an embodiment of the present invention.

FIG. 8 is a block diagram of an adjustment target by an embodiment of the present invention.

DETAILED DESCRIPTION OF THE INVENTION

Below are further described the specific implementation way of the present invention in conjunction with the drawings and examples. The following embodiments are used to clarify this invention but shall not limit the scope of this invention. The following embodiments are used to clarify this invention but shall not limit the scope of this invention.

Figure 1:
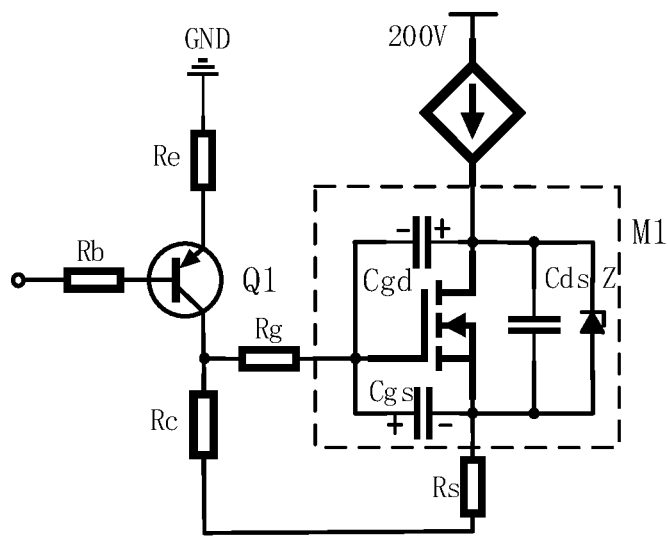
FIG. 1 is a schematic diagram of a switching speed adjustment system for the MOSFET according to an embodiment of the present invention.

FIG. 1 is a circuit diagram of a switching speed adjustment system of a MOSFED provided by an embodiment of the present invention. As shown in FIG. 1, this system comprises MOSFET (M1) and a drive switch (Q1) which is connected to (M1). The collector (c) of the drive switch (Q1) is connected to the grid (g) of the MOSFET (M1) through the grid resistor ($R_g$), the emitter (e) of the drive switch (Q1) is grounded through the emitter resistor ($R_e$), and the collector (c) of the drive switch (Q1) is also connected to the source resistor ($R_s$) through the collector resistor ($R_c$). the other end of the source resistor ($R_s$) is connected to the source (s) of the MOSFET; the drain (d) of the MOSFET is connected to the current source.

Optionally, the emitter resistor and the collector resistor can be adjustable resistors. See FIG. 7. That is, the resistance values of the emitter resistor and the collector resistor are variable within a corresponding range.

As shown in FIG. 1, the MOSFET has an inter-electrode capacitance, i.e., the inter-electrode capacitor ($C_{gd}$) between the grid (g) and drain (d), the inter-electrode capacitor ($C_{gs}$) between the grid (g) and source (s), the inter-electrode capacitor ($C_{ds}$) between the drain (d) and source (s).

Optionally, the base (e) of the drive switch (Q1) is also connected to the base resistor $R_e$. The drive switch can be made of PNP-type triode.

In the switching speed adjustment system of the MOSFET, when the input signal $V_b$ becomes a step-up signal, the driving circuit (Q1) will turn off, and the voltage drop of collector resistor ($R_c$) will decrease, and then the MOSFET (M1) will shut off. Meanwhile, the pressure drop ($C_{ds}$) of the MOSFET (M1) will increase. The turn-off process for MOSFET (M1) will delay due to the influence of inter-electrode capacitor.

Figure 2:
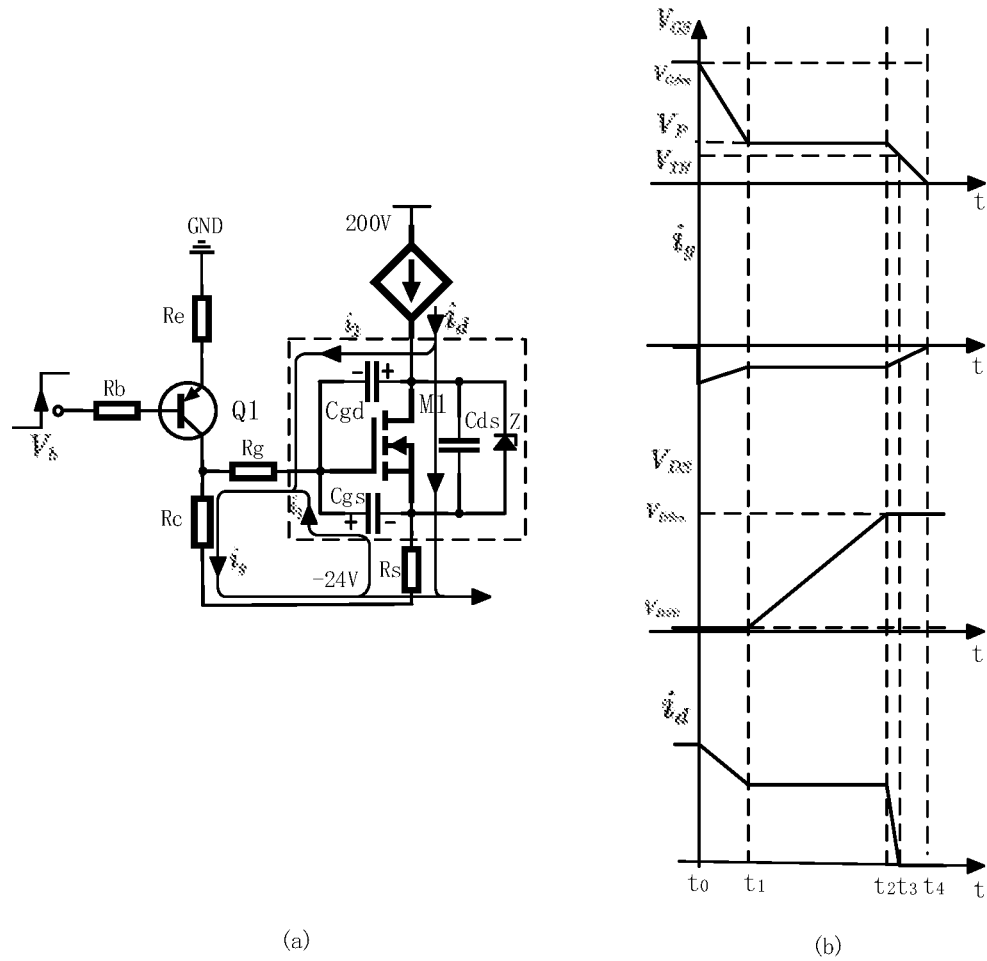
FIG. 2 is a schematic diagram of the turn-off process for the MOSFET provided by an embodiment of the present invention.

Specifically, the turn-off process of the MOSFET can be divided into 4 stages for analysis according to a schematic diagram of the turn-off process for the MOSFET as shown in FIG. 2. The curves for the variation of voltage and current in each stage are shown in part (b) of the FIG. 2, and the current flows are shown in part (a) of the FIG. 2.

The first stage [$t_0$~$t_1$]: the voltage ($V_{GS}$) for ($C_{gs}$) of MOSFET (M1) decrease, and ($C_{gs}$) discharge. The current ($i_g$) of the grid can be calculated through the equation (1-12), and $i_g$ is equal to the discharge current ($i_1$). $i_g$ decreases as the inter-electrode voltage decreases. According to the transconductance effect of the MOSFET, it can be known from equation (1-13) that the drain current ($i_d$) will decrease, moreover the voltage ($V_{GS}$) for ($C_{gs}$) of MOSFET (M1) decrease to the plateau voltage $V_p$, before the $V_{DS}$ for $C_{ds}$ starts to change, and the plateau voltage ($V_p$) can be calculated through equation (1-14).

$$i_g = \frac{dV_{GS}}{dt}C_{gs} = -\frac{V_{GSm}}{R_g + R_c} \cdot e^{\left(-\frac{t}{(R_g+R_c)C_{gs}}\right)} \quad (1\text{-}12)$$

$$i_d = 2k_n(V_{GS} - V_{TH})V_{DS0} \quad (1\text{-}13)$$

$$V_P = 2V_{DS0} + V_{TH} \quad (1\text{-}14)$$

Among the above equation, ($V_{GSm}$) is the initial value for the voltage of ($C_{gs}$) in the turn-off process of the MOSFET (M1), ($k_n$) is the conduction factor of the MOSFET (M1), ($V_{TH}$) is the turn-on voltage of the MOSFET (M1), ($V_{DS0}$) is the initial value for the voltage of ($C_{ds}$) in the turn-off process of the MOSFET (M1).

The second stage [$t_1$~$t_2$]: as the drain current ($i_d$) of the MOSFET (M1) decreases, the pressure drop on the current source begins to decrease, and the voltage ($V_{DS}$) for ($C_{ds}$) of the MOSFET (M1) begins to increase. However, as long as the voltage ($V_{DS}$) of ($C_{ds}$) tends to increase, the inter-electrode capacitor ($C_{gd}$) of the MOSFET (M1) needs to be charged to increase its pressure drop, and the charging current ($i_2$) is provided by the current source ($I_D$). At this point, the charging current ($i_2$) of the inter-electrode capacitor ($C_{gd}$) is in the opposite direction to the discharging current ($i_1$) of the capacitor ($C_{gs}$), the current ($i_2$) will limit the capacitor ($C_{gs}$) discharge, so that the voltage ($V_{GS}$) of the ($C_{gs}$) in the MOSFET (M1) will remain constant at the Plateau voltage ($V_P$). The grid current ($i_g$) is approximately equal to the charging current ($i_2$), which can be calculated through the following equation (1-15); and the drain current ($i_d$) will also remain constant due to the constant ($C_{gs}$) according to the following equation (1-16). In this process, the voltage ($V_{DS}$) of the ($C_{ds}$), is continuously increasing, meanwhile, the inter-electrode capacitor ($C_{gd}$), is constantly being charged.

$$i_g = -\frac{dV_{DS}}{dt}C_{gd} = -\frac{V_{DSm}}{R_g + R_c} \cdot e^{\left(-\frac{t}{(R_g+R_c)C_{gd}}\right)} \quad (1\text{-}15)$$

$$i_d = k_n(V_P - V_{TH})^2 \quad (1\text{-}16)$$

The third stage [$t_2$~$t_3$]: When the ($V_{DS}$) rises to ($V_{DSm}$) and reaches the voltage value of DC power supply, the current source ($I_D$) stops charging the capacitor ($C_{gd}$), and the value of the ($V_{GS}$) continues to drop until it drops to the turn-on voltage ($V_{TH}$) of the MOSFET. At this point, the grid current ($i_g$) is equal to the discharge current ($i_1$) of the capacitor ($C_{gs}$), and can be calculated through the equation (1-12). The drain current ($i_d$) also gradually decreases to zero as the voltage ($V_{GS}$) decreases.

The fourth stage [$t_3$~$t_4$]: At this stage, the capacitor ($C_{gs}$) continues to discharge, and the voltage ($V_{GS}$) gradually decreases to zero. At this point, the MOSFET (M1) is completely turned off, and the drain voltage remains at ($V_{DSm}$).

According to the four stages of the turn-off process, when the voltage ($V_{DS}$) of ($C_{ds}$) increase along with the plateau of voltage ($V_{GS}$) of ($C_{gs}$), that is, during the period of the plateau voltage ($V_P$), the grid current ($i_g$) is almost entirely used to charge the inter-electrode capacitor ($C_{gd}$) to make the voltage of ($C_{ds}$) rise, while the gate-source voltage ($V_{GS}$) remains unchanged at the plateau voltage ($V_P$).

When the input signal ($V_b$) is being a step-down signal, the collector current of the driving switch (Q1) increases, that causes the pressure drop of the resistor ($R_c$) to rise. And then the (M1) will be turned on, so as to cause the voltage ($V_{DS}$) of the ($C_{ds}$) in the (M1) to decrease. However, the turn-on process of the M1 will be delayed due to the influence of the inter-electrode capacitor of the (M1).

Figure 3:
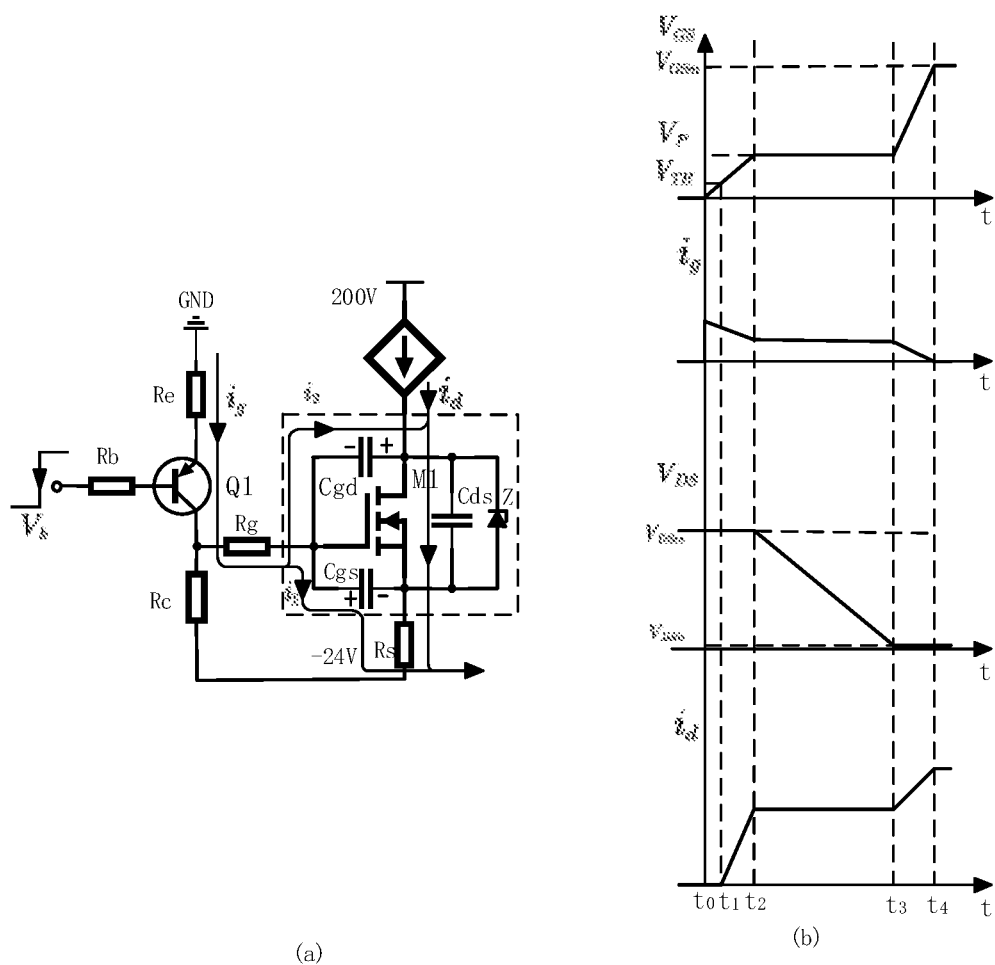
FIG. 3 is a schematic diagram of the turn-on process for the MOSFET provided by an embodiment of the present invention.

Specifically, the turn-on process can be divided into four stages for analysis according to the schematic diagram of the turn-on process for the MOSFET in FIG. 3. The voltage and current change curves of each stage are shown in part (b) of FIG. 3, and the current flow is shown in part (a) of FIG. 3.

The first stage [$t_0$~$t_1$]: The gate-source voltage ($V_{GS}$) of the (M1) rises, the inter-electrode capacitor ($C_{gs}$) between the gate and source needs to be charged, and the dynamic drive current ($i_g$) of the (Q1) provides the charging current ($i_1$). The grid current ($i_g$) is calculated through the following equation (1-17). During this period, the (M1) is gradually turned on, and the voltage ($V_{GS}$) of ($C_{gs}$) will rise to the turn-on voltage ($V_{TH}$).

$$i_g = \frac{V_{GSm}}{R_g + R_e} \cdot e^{\left(-\frac{t}{(R_g+R_e)C_{gs}}\right)} \quad (1\text{-}17)$$

The second stage [$t_1$~$t_2$]: In this process, the gate current ($i_g$) continues to charge the inter-electrode capacitor ($C_{gs}$) until the voltage ($V_{GS}$) of the ($C_{gs}$) increase to the plateau voltage ($V_P$), and according to the equation (1-16), the drain current ($i_d$) increases with the gate-source voltage ($V_{GS}$).

The third stage [$t_2$~$t_3$]: When the voltage ($V_{GS}$) of the ($C_{gs}$) increases to the plateau voltage ($V_P$), the MOSFET (M1) is turned on to maximum, the drain current ($i_d$) continues to increase, the pressure drop of the current source is also increased, and the voltage ($V_{DS}$) of the ($C_{ds}$) begins to decrease. At this time, the inter-electrode capacitor ($C_{gd}$) needs to be discharged to reduce the voltage ($V_{DS}$), however, the MOSFET (M1) has not been fully turned on and cannot provide a fast discharge circuit. Therefore, almost all the gate current ($i_g$) charges it reversely. The current ($i_g$) can be calculated through the following equation (1-18). Meanwhile, because the inter-electrode capacitor ($C_{gs}$) stops charging, the voltage ($V_{GS}$) of ($C_{gs}$) keeps constant at the voltage ($V_P$), and the voltage ($V_{DS}$) of the ($C_{ds}$) continues to decrease to the minimum value at the voltage ($V_{DSO}$).

$$i_g = \frac{dV_{DS}}{dt}C_{gd} = \frac{V_{DSm}}{R_g + R_e} \cdot e^{\left(-\frac{t}{(R_g+R_e)C_{gd}}\right)} \quad (1\text{-}18)$$

The fourth stage [$t_3$~$t_4$]: In this stage, the gate current ($i_g$) continues to charge the inter-electrode capacitor ($C_{gs}$), so as to make the voltage ($V_{GS}$) of ($C_{gs}$) rise to the maximum. Meanwhile, according to the equation (1-13), the drain current ($i_d$) increases with the voltage ($V_{GS}$). At this point, the MOSFET (M1) is completely turned on, and the voltage of ($C_{ds}$) remains constant at ($V_{DSO}$).

According to the four stages of the turn-on process, when the voltage ($V_{DS}$) of ($C_{ds}$) falls along with the plateau of the voltage ($V_{GS}$) of ($C_{gs}$), that is, during the period of the plateau voltage ($V_P$), the gate current ($i_g$) is almost entirely used to charge the inter-electrode capacitor ($C_{gd}$), so that the voltage of ($C_{ds}$) drops, while the gate-source voltage ($V_{GS}$) remains constant at the plateau voltage ($V_P$).

According to the four stages from the turn-off process and the four stages from the turn-on process, the faster the inter-electrode capacitor ($C_{gd}$) is being charged and discharged, the shorter plateau period for voltage ($V_{GS}$) of the ($C_{gd}$) will be, the more quickly the voltage ($V_{DS}$) of the ($C_{ds}$) will change, the more quickly the switching speed of the (M1) will get. While the smaller the ($i_g$) is getting, the faster the inter-electrode capacitor ($C_{gd}$) will be charged and discharged. According to the equation (1-15), it can be known that during the turn-off process, the value of ($i_g$) is related to the resistance value of ($R_c$); during the turn-on process, the value of ($i_g$) is related to the resistance value of ($R_e$). Based on the above two relationships, this invention provides the following method for adjusting the switching speed of the MOSFET.

Figure 4:
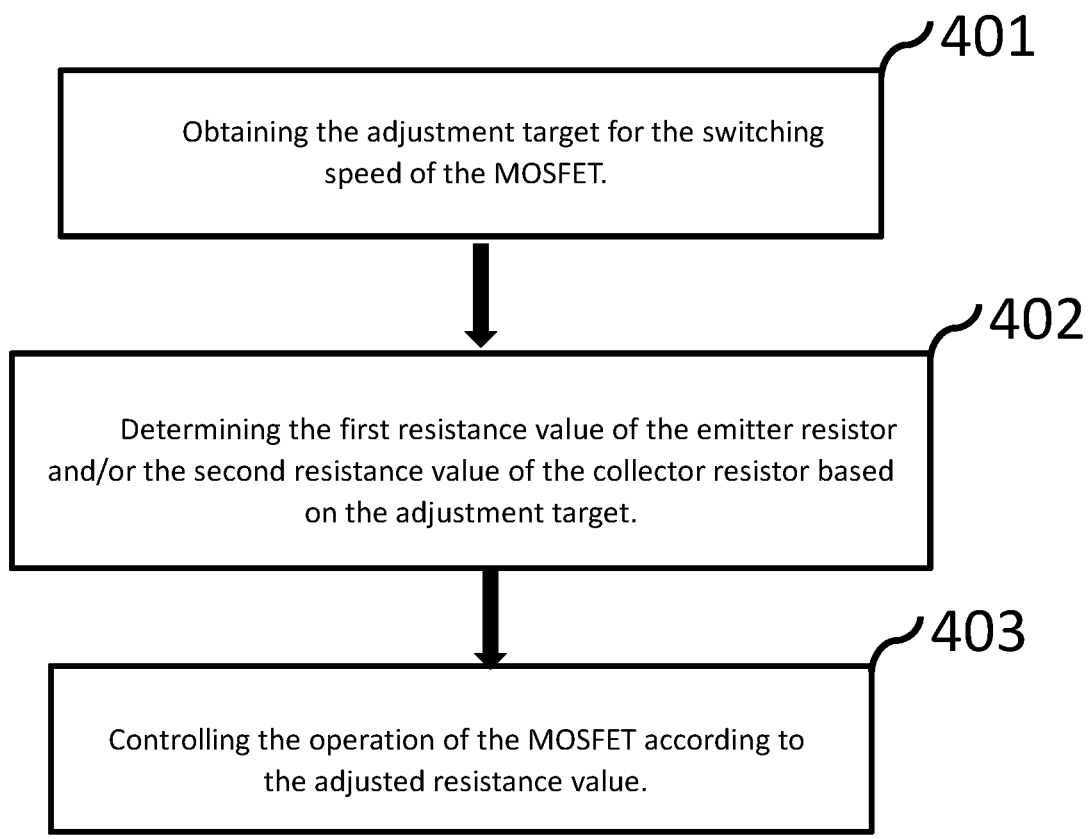
FIG. 4 is a flowchart of a switching speed adjustment method for the MOSFET provided by an embodiment of the present invention.

FIG. 4 is a flowchart of a switching speed adjustment method for the MOSFET provided by an embodiment of the present invention. The present embodiment is illustrated by the invention of the method to the switching speed regulation system of a MOSFET shown in FIG. 1. The method comprises at least the following steps:

Step 401, obtaining the adjustment target for the switching speed of the MOSFET.

The adjustment target is used to indicate the turn-on speed and/or turn-off speed of the MOSFET.

Step 402, determining the first resistance value of the emitter resistor and/or the second resistance value of the collector resistor based on the described target In one embodiment, the adjustment target comprises:
a first adjustment target for adjusting the turn-on speed and determining the first resistance value of the emitter resistor, and/or
a second adjustment target for adjusting the turn-off speed and determining the second resistance value of the collector resistor.

The turn-on speed indicated by the first adjustment target is negatively correlated with the first resistance value; the turn-off speed indicated by the second adjustment target is negatively correlated with the second resistance value.

Optionally, the step of determining the first resistance value of the emitter resistor based on the first adjustment target comprises: obtaining a first corresponding relationship between the turn-on speed and the resistance value of the emitter resistor, determining the first resistance value corresponding to the turn-on speed that is indicated by the first adjustment target according to the first correspondence.

Optionally, the step of determining the second resistance value of the collector resistor based on the second adjustment target comprises: obtaining a second corresponding relationship between the turn-off speed and the resistance value of the collector resistor, determining the second resistance value corresponding to the turn-off speed that is indicated by the second adjustment target according to the second correspondence.

Step 403, controlling the operation of the MOSFET according to the adjusted resistance value.

In summary, the method for adjusting the switching speed of the MOSFET provided in this embodiment can be achieved through the following steps:
obtaining the adjustment target for the switching speed of the MOSFET;
determining the first resistance value of the emitter resistor and/or the second resistance value of the collector resistor based on the adjustment target;
controlling the operation of the MOSFET.

This method can solve the problem that the current MOSFET would slow down the turn-on and turn-off speed due to the Miller effect. Since the turn-off speed of the MOSFET can be adjusted by the resistance value of the collector resistor, and/or the turn-on speed of the MOSFET can be adjusted by the resistance value of the emitter resistor, it can achieve the effect of the switching speed adjustment for the MOSFET as required.

Figure 5:
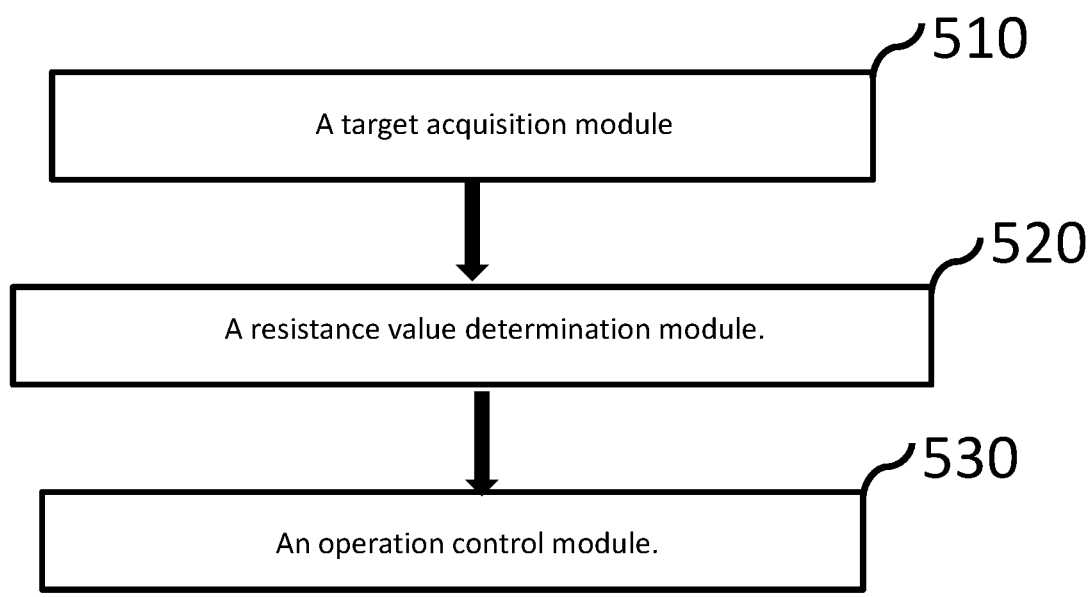
FIG. 5 is a block diagram of a switching speed adjustment device for the MOSFET provided by an embodiment of this invention.

FIG. 5 is a block diagram of a switching speed adjustment device for the MOSFET provided by an embodiment of this invention. The present embodiment is illustrated by the invention of the device in the switching speed adjustment system of a MOSFET as shown in FIG. 1. The MOSFET is connected to drive switch, the collector of the drive switch is connected to the grid of the MOSFET through the grid resistor, the emitter of the drive switch is grounded through the emitter resistor, and the collector of the drive switch is also connected to the source resistor through the collector resistor. The other end of the source resistor is connected to the source of the MOSFET; the drain of the MOSFET is connected to the current source. This device comprises at least the following modules: a target acquisition module (510), a resistance value determination module (520) and an operation control module (530).

Figure 6:
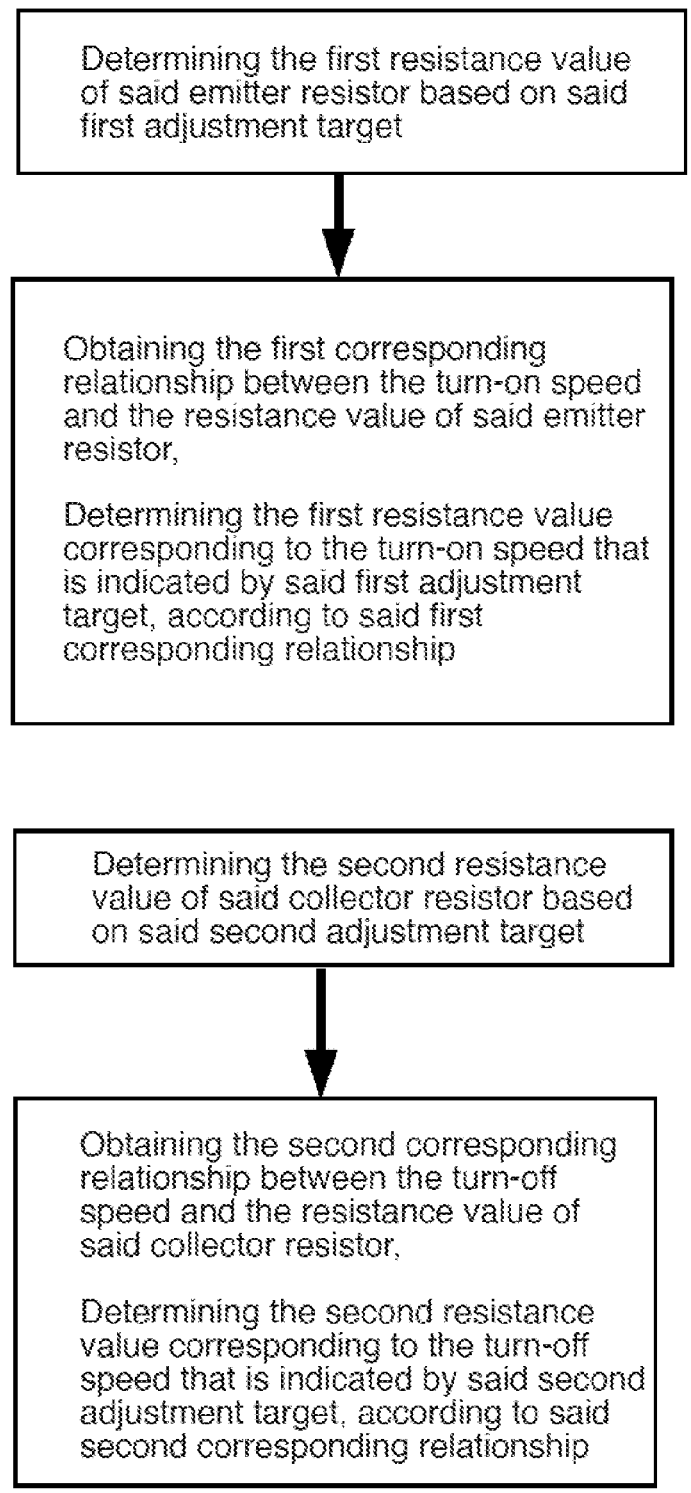
FIG. 6 is a block diagram of determining the first resistance value of an emitter resistor based on first adjustment target provided by an embodiment of the present invention.

A target acquisition module (510) for obtaining the adjustment target of the switching speed for the MOSFET As showing in FIG. 6, a resistance determination module (520) for determining the first resistance value of the emitter resistor and/or the second resistance value of the collector resistor based on the described target, An operation control module (530) for controlling the operation of the MOSFET according to the adjusted resistance value.

Optionally, as shown in FIG. 8, a resistance determination module (520) is used for the adjustment target which comprises
a first adjustment target for adjusting the turn-on speed and determining the first resistance value of the emitter resistor, and/or
a second adjustment target for adjusting the turn-off speed and determining the second resistance value of the collector resistor.

Optionally, the turn-on speed indicated by the first adjustment target is negatively correlated with the first resistance value; the turn-off speed indicated by the second adjustment target is negatively correlated with the second resistance value.

Refer to the above method embodiments for details.

It should be noted that when performing the switching speed adjustment for the MOSFET, the switching speed adjustment device of the MOSFET in the foregoing embodiments is simply illustrated by the division of the above functional modules. That is, the internal structure of the switching speed adjustment device of the MOSFET is divided into different functional modules to complete all or parts of the functions described above. In addition, the switching speed adjustment device and the switching speed adjustment method of the MOSFET provided by the above-mentioned embodiments belong to a same concept, and the specific implementation process is detailed in the method embodiment, which will not be repeated here.

Optionally, the present invention also provides a computer-readable storage medium in which a program is stored, and the program is loaded and executed by the processor to implement a method for adjusting the switching speed of the MOSFET embodiments of the foregoing method.

Optionally, this invention also provides a computer product that includes a computer-readable storage medium in which a program is stored, and the program is loaded and executed by a processor to implement a method for adjusting the switching speed of a MOSFET for embodiments of the foregoing method.

The technical features of the foregoing embodiments may be combined arbitrarily. For the sake of brevity, all possible combinations of the technical features of the foregoing embodiments are not described. However, as long as there is no contradiction in the combinations of these technical features, all shall be considered to be within the scope of this specification The foregoing description has been made on several embodiments of this invention which are relatively specific and detailed, however the invention is not limited thereto. It should be further understood by those skilled in the art that various changes and modifications may be made without departing from the spirit of the invention are protected by this invention. Therefore, the scope of protection for this invention shall be subject to the appended claims.

What is claimed is:

1. A method of adjusting the switching speed of a MOSFET, the method comprising controlling the switching speed of the MOSFET via a drive switch, a gate resistor, an emitter resistor, and a source resistor, wherein a collector of said drive switch is connected to a gate of said MOSFET through the gate resistor, an emitter of said drive switch is grounded through the emitter resistor, the collector of said drive switch is connected to a first end of the source resistor through the collector resistor, the other end of said source resistor is connected to the source of said MOSFET, the drain of said MOSFET is connected to a current source;

adjusting the switching speed of said MOSFET to an adjustment target by adjusting a first resistance value of said emitter resistor and/or a second resistance value of said collector resistor based on said adjustment target, wherein adjusting the first resistance value of said emitter resistor and/or the second resistance value of said collector resistor based on said adjustment target comprises:

a, adjusting the turn-on speed by altering the first resistance value of said emitter resistor, and/or b, adjusting the turn-off speed by altering the second resistance value of said collector resistor.

2. A method according to claim 1, is characterized in that, the turn-on speed indicated by said first adjustment target is negatively correlated with said first resistance value, the turn-off speed indicated by said second adjustment target is negatively correlated with said second resistance value.

3. A method according to claim 1, is characterized in that, said method of determining the first resistance value of said emitter resistor based on said first adjustment target, comprises:

obtaining the first corresponding relationship between the turn-on speed and the resistance value of said emitter resistor, determining the first resistance value corresponding to the turn-on speed that is indicated by said first adjustment target, according to said first corresponding relationship.

4. A method according to claim 1, is characterized in that, said method of determining the second resistance value of said collector resistor based on said second adjustment target, comprises:

obtaining the second corresponding relationship between the turn-off speed and the resistance value of said collector resistor, determining the second resistance value corresponding to the turn-off speed that is indicated by said second adjustment target, according to said second corresponding relationship.

5. A method according to claim 1, is characterized in that, said drive switch can be made of PNP-type triode.

6. A method according to claim 1, is characterized in that, said emitter resistor and said collector resistor can be adjustable resistors.

7. A switching speed adjustment device for MOSFET, is characterized in that, the switching speed for said MOSFET is controlled via a drive switch, a gate resistor, an emitter resistor, and a source resistor, wherein a collector of said drive switch is connected to a gate of said MOSFET through the gate resistor, an emitter of said drive switch is grounded through the emitter resistor, the collector of said drive switch is connected to a first end of the source resistor through the collector resistor, the other end of said source resistor is connected to the source of said MOSFET, the drain of said MOSFET is connected to a current source, said device comprising:

a resistance determination module for determining a first resistance value of said emitter resistor and/or a second resistance value of said collector resistor based on an adjustment target of the switching speed for said MOSFET;

wherein said adjustment target comprises:

c, a first adjustment target for adjusting the turn-on speed to determine the first resistance value of said emitter resistor, and/or d, a second adjustment target for adjusting the turn-off speed to determine the second resistance value of said collector resistor; and an operation control module for controlling the operation of said MOSFET according to the first resistance value and/or the second resistance value.

8. A device according to claim 7, is characterized in that, the turn-on speed indicated by said first adjustment target is negatively correlated with said first resistance value, the turn-off speed indicated by said second adjustment target is negatively correlated with said second resistance value.

* * * * *